US012120783B2

United States Patent
Takebayashi et al.

(10) Patent No.: US 12,120,783 B2
(45) Date of Patent: Oct. 15, 2024

(54) CERAMIC HEATER

(71) Applicant: NGK INSULATORS, LTD., Nagoya (JP)

(72) Inventors: Hiroshi Takebayashi, Handa (JP); Joyo Ito, Handa (JP); Daisuke Inoue, Nagoya (JP)

(73) Assignee: NGK INSULATORS, LTD., Nagoya (JP)

( * ) Notice: Subject to any disclaimer, the term of this patent is extended or adjusted under 35 U.S.C. 154(b) by 397 days.

(21) Appl. No.: 17/304,748

(22) Filed: Jun. 25, 2021

(65) Prior Publication Data

US 2022/0110190 A1 Apr. 7, 2022

(30) Foreign Application Priority Data

Oct. 2, 2020 (JP) .................. 2020-167627

(51) Int. Cl.
| | |
|---|---|
| H05B 3/14 | (2006.01) |
| H05B 3/03 | (2006.01) |
| H05B 3/08 | (2006.01) |
| H05B 3/18 | (2006.01) |
| H05B 3/28 | (2006.01) |

(52) U.S. Cl.
CPC .............. *H05B 3/143* (2013.01); *H05B 3/03* (2013.01); *H05B 3/08* (2013.01); *H05B 3/18* (2013.01); *H05B 3/283* (2013.01); *H05B 2203/002* (2013.01)

(58) Field of Classification Search
CPC . H05B 3/143; H05B 3/03; H05B 3/08; H05B 3/18; H05B 3/283; H05B 2203/002
See application file for complete search history.

(56) References Cited

U.S. PATENT DOCUMENTS

2016/0307787 A1   10/2016   Uemura et al.

FOREIGN PATENT DOCUMENTS

| JP | 2002313530 A | * | 10/2002 | |
|---|---|---|---|---|
| JP | 2009-059539 A | | 3/2009 | |
| JP | 2017-152317 A | | 8/2017 | |
| JP | 2017152137 A | * | 8/2017 | |
| JP | 2017152537 A | * | 8/2017 | |
| JP | 6510440 B2 | | 5/2019 | |
| TW | 201703581 A | | 1/2017 | |
| WO | WO-2004089039 A1 | * | 10/2004 | ....... H01L 21/67109 |

OTHER PUBLICATIONS

Korean Office Action (Application No. 10-2021-0082953) dated Apr. 4, 2023 (with English translation).
Taiwanese Office Action dated Jul. 7, 2022 (Application No. 110123987).
Japanese Office Action (Application No. 2020-167627) dated Mar. 28, 2023 (with English translation).

* cited by examiner

*Primary Examiner* — Janie M Loeppke
*Assistant Examiner* — Theodore J Evangelista
(74) *Attorney, Agent, or Firm* — BURR PATENT LAW, PLLC (57) ABSTRACT

A ceramic heater including a heater electrode embedded in a plate made of ceramic, wherein, of the heater electrode, a specific area surrounding portion surrounding a specific temperature area in which temperature of the plate becomes low has a smaller thickness than a normal portion of the heater electrode.

4 Claims, 9 Drawing Sheets

CERAMIC HEATER

BACKGROUND OF THE INVENTION

1. Field of the Invention

The present invention relates to a ceramic heater.

2. Description of the Related Art

There has hitherto been known an electrostatic chuck heater including a ceramic-made plate in which an electrostatic chuck electrode and a heater electrode are embedded, and a support made of metal, such as aluminum, and joined to the plate. The electrostatic chuck heater is demanded to uniformly heat a wafer. To meet such a demand, regarding an area of the electrostatic chuck heater (hereinafter called a "specific temperature area") in which temperature becomes low, it is proposed to increase an amount of heat generation by reducing a width and/or a line interval of the heater electrode that is disposed around the specific temperature area. For example, Patent Literature 1 discloses an electrostatic chuck heater in which the width of the heater electrode around the specific temperature area is reduced.

CITATION LIST

Patent Literature

PTL 1: JP 6510440 B

SUMMARY OF THE INVENTION

However, there is a possibility of disconnection if the width of the heater electrode is reduced too much around the specific temperature area, and there is a possibility of a short circuit if the line interval of the heater electrode is reduced too much. Thus, because of a limitation in reducing the width and/or the line interval of the heater electrode, the amount of heat generation cannot be increased so much. When the number of regions where the width and/or the line interval of the heater electrode is reduced increases, another problem arises in that an improvement of soaking performance in the entire plate is difficult to realize from the point of design.

The present invention has been made with intent to solve the above-described problem, and a main object of the present invention is to facilitate soaking design around the specific temperature area.

The present invention provides a ceramic heater including a heater electrode embedded in a plate made of ceramic,
  wherein, of the heater electrode, a specific area surrounding portion surrounding a specific temperature area in which temperature of the plate becomes low has a smaller thickness than a normal portion of the heater electrode.

In the above-described ceramic heater, of the heater electrode, the specific area surrounding portion surrounding the specific temperature area in which the temperature of the plate becomes low has a smaller thickness than the normal portion of the heater electrode. In other words, the specific area surrounding portion has a smaller cross-sectional area and larger resistance than the normal portion of the heater electrode. Therefore, an amount of heat generated when a current is applied to flow through the heater electrode is larger in the specific area surrounding portion than in the normal portion, and hence a reduction of the temperature in the specific temperature area can be suppressed. As a result, soaking design for a region around the specific temperature area of the plate can be facilitated.

In the ceramic heater according to the present invention, the normal portion of the heater electrode may be a portion adjacent to the specific area surrounding portion.

In the ceramic heater according to the present invention, a width of the heater electrode in the specific area surrounding portion may be equal to a width of the heater electrode in the normal portion. With this feature, since the width of the heater electrode in the specific area surrounding portion is not different from that of the heater electrode in the normal portion, wiring of the heater electrode can be relatively easily designed.

In the ceramic heater according to the present invention, the specific temperature area may be a through-hole penetrating through the plate, the heater electrode may include multiple resistance heating line portions that are wired to surround the through-hole, and assuming that a number n (n is an integer of two or more) of round shape lines centered at the through-hole with different sizes are drawn and part of one of the multiple resistance heating line portions which is k-th (k is an integer of 1 or more and n or less) closest to the through-hole, the part being included within the k-th smallest round shape line, is defined as a k-th small region, the specific area surrounding portion may be formed of a region consisting of a collection of the first to n-th small regions. With this feature, the specific area surrounding portion can locally generate a larger amount of heat than the normal portion. Each of the multiple resistance heating line portions may be part of one resistance heating line that is wired in a one-stroke pattern from one terminal to the other terminal, or part of different resistance heating lines.

In the ceramic heater according to the present invention, the specific temperature area may be a midpoint of a segment connecting a pair of terminals of the heater electrode, the terminals being arranged oppositely apart from each other, the heater electrode may include multiple resistance heating line portions, the multiple resistance heating line portions including a resistance heating line portion that extends from each of the pair of terminals in opposite directions and one or more resistance heating line portions that are disposed around the pair of terminals, and assuming that a number n (n is an integer of two or more) of round shape lines centered at the midpoint with different sizes are drawn and part of one of the multiple resistance heating line portions which is k-th (k is an integer of 1 or more and n or less) closest to the midpoint, the part being included within the k-th smallest round shape line, is defined as a k-th small region, the specific area surrounding portion may be formed of a region consisting of a collection of the first to n-th small regions. With this feature, the specific area surrounding portion can locally generate a larger amount of heat than the normal portion. Each of the multiple resistance heating line portions may be part of one resistance heating line that is wired in a one-stroke pattern from one terminal to the other terminal, or part of different resistance heating lines.

In the ceramic heater according to the present invention, an m-th (m is an integer of 1 or more and (n−1) or less) small region of the specific area surrounding portion may be thinner than an (m+1)-th small region. With this feature, the amount of heat generation in a region of the specific area surrounding portion farther away from the specific temperature area is smaller than that in a region of the specific area surrounding portion nearer to the specific temperature area. Therefore, the soaking design can be further facilitated.

In the ceramic heater according to the present invention, the round shape line may be a true circle, an ellipse, or an oblong circle. With this feature, since the round shape line has a relatively simple shape, the specific area surrounding portion can be relatively easily formed. Here, the oblong circle implies a shape obtained by joining, to each of two opposite sides of a rectangle, a semicircle with a diameter being equal to a length of the opposite sides.

In the ceramic heater according to the present invention, the heater electrode may have a structure in which multiple resistance heating layers are laminated, and the number of the laminated resistance heating layers may be smaller in the specific area surrounding portion than in the normal portion. With this feature, the specific area surrounding portion can be relatively easily fabricated.

DETAILED DESCRIPTION OF THE INVENTION

Figure 1:
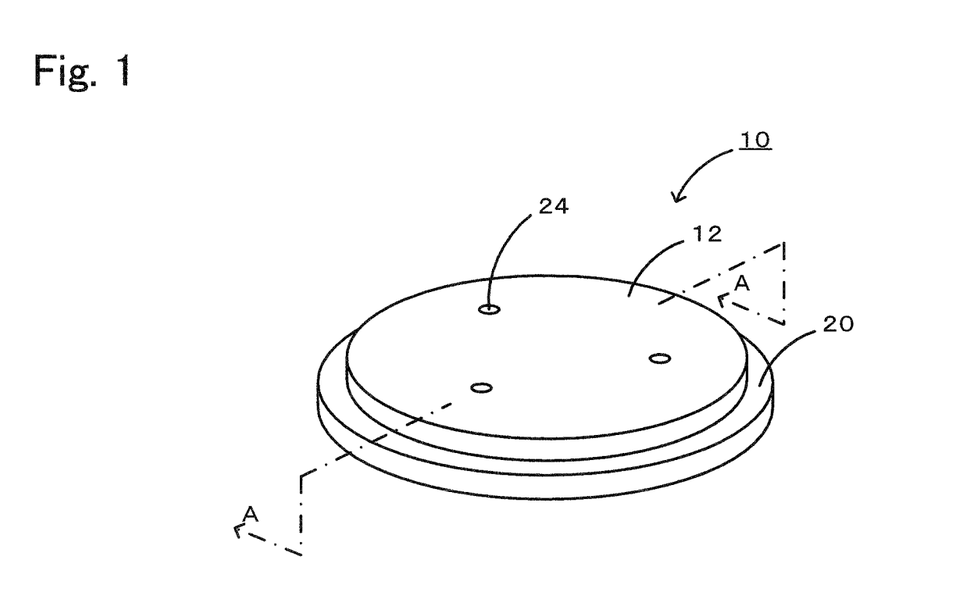
FIG. 1 is a perspective view of an electrostatic chuck heater 10.
Figure 2:
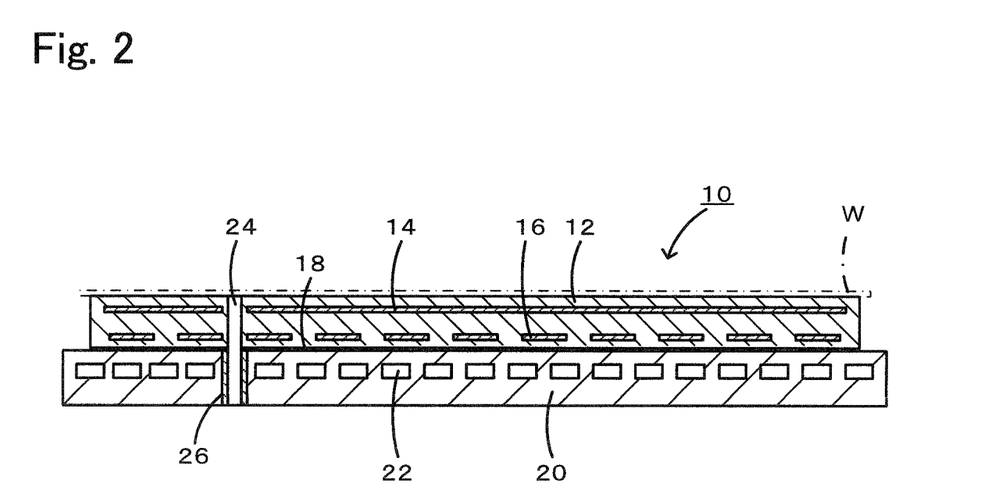
FIG. 2 is a sectional view taken along A-A in FIG. 1.
Figure 3:
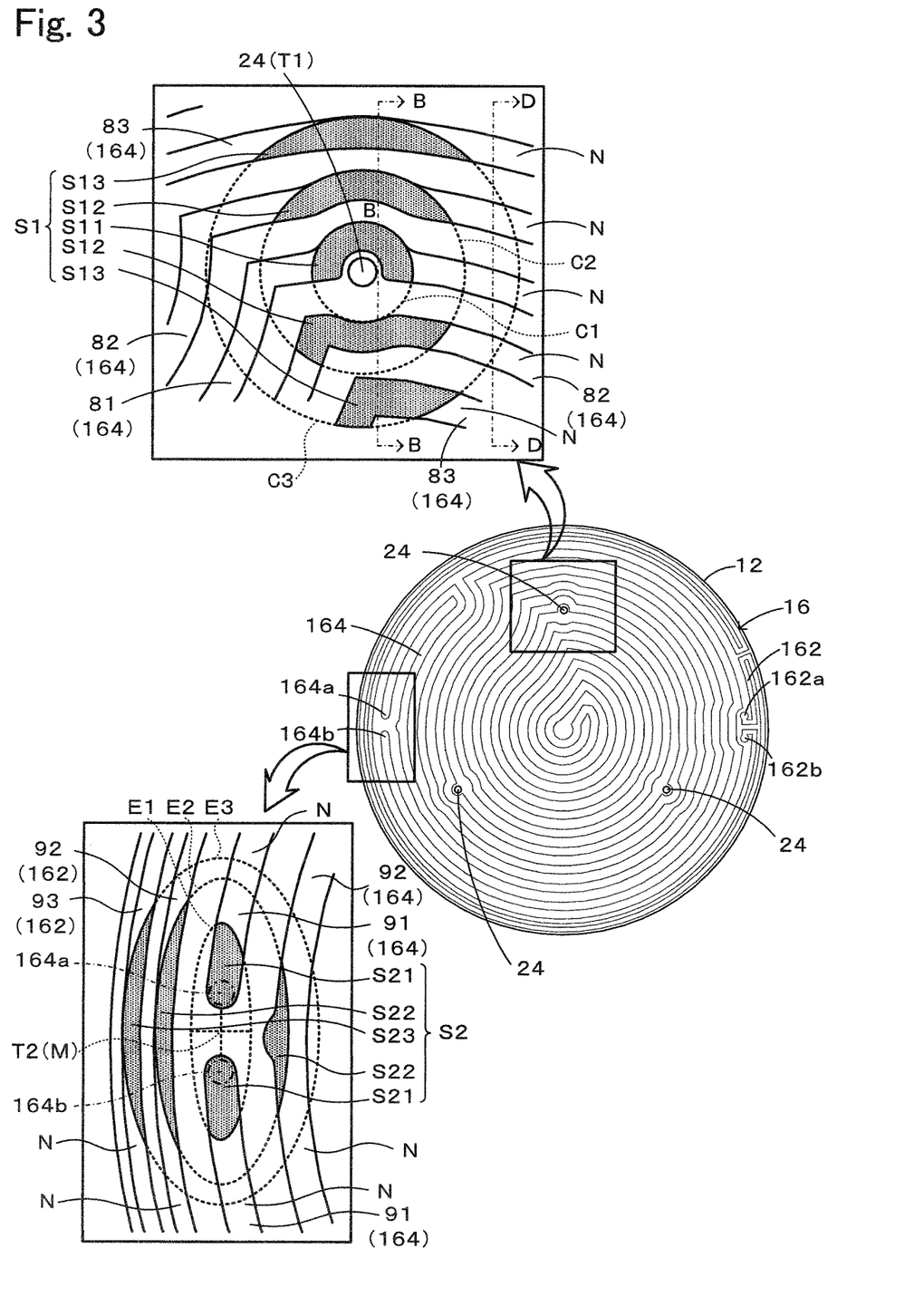
FIG. 3 is an explanatory view when looking at a heater electrode 16 in a plan view.
Figure 4:
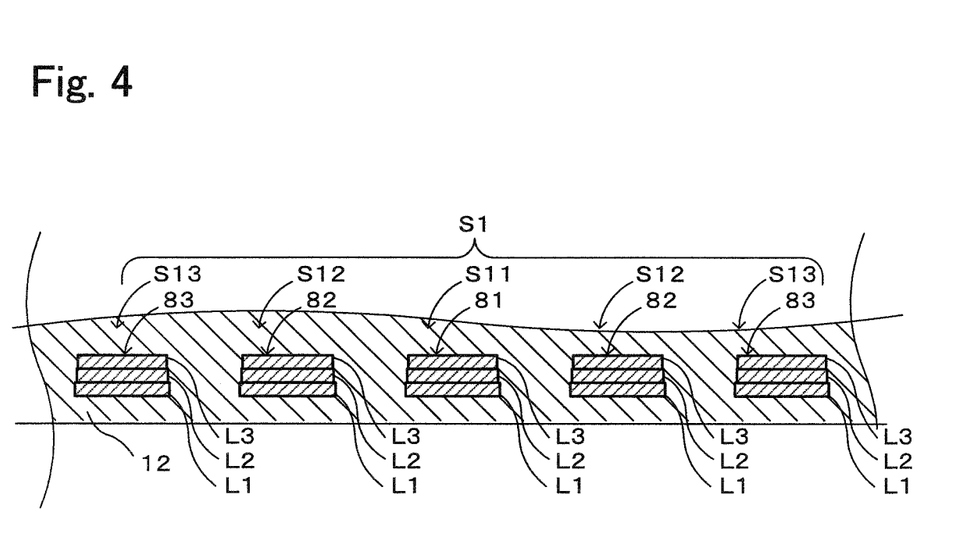
FIG. 4 is a sectional view taken along B-B in FIG. 3.
Figure 5:
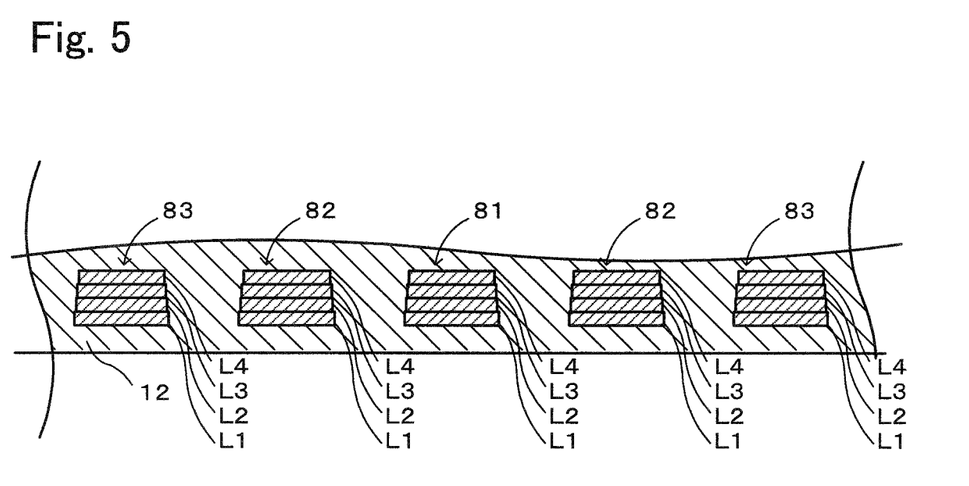
FIG. 5 is a sectional view taken along D-D in FIG. 3.

An embodiment of the present invention will be described below with reference to the drawings. FIG. 1 is a perspective view of an electrostatic chuck heater 10 according to the present invention, FIG. 2 is a sectional view taken along A-A in FIG. 1, FIG. 3 is an explanatory view when looking at a heater electrode 16 in a plan view, FIG. 4 is a sectional view taken along B-B in FIG. 3, and FIG. 5 is a sectional view taken along D-D in FIG. 3.

The electrostatic chuck heater 10 includes a plate 12, a cooling plate 20, and multiple through-holes 24.

The plate 12 is in the form of a disk made of ceramic (for example, alumina or aluminum nitride) and having an upper surface on which a wafer W can be placed. The plate 12 includes an electrostatic electrode 14 and a heater electrode 16 both embedded therein.

The electrostatic electrode 14 is formed in a circular thin-film shape. A rod-like terminal, not illustrated, is electrically connected to the electrostatic electrode 14. The rod-like terminal extends from a lower surface of the electrostatic electrode 14 and, after passing through the plate 12, it further extends downward through the cooling plate 20 in an electrically insulated state. A portion of the plate 12 above the electrostatic electrode 14 functions as a dielectric layer.

As illustrated in FIG. 3, the heater electrode 16 is a strip-shaped line in a plan view. The strip-shaped line is not limited to a specific one and may be set to have a width of 0.1 to 10 mm, a thickness of 0.001 to 0.1 mm, and a line-to-line distance of 0.1 to 5 mm, for example. The heater electrode 16 includes an outer-peripheral heater electrode 162 that is formed in an outer peripheral portion of the plate 12 by wiring a resistance heating line in a one-stroke pattern from a terminal 162a positioned at one end thereof to a terminal 162b positioned at the other end, and a central heater electrode 164 that is formed in a central portion of the plate 12 by wiring a resistance heating line in a one-stroke pattern from a terminal 164a positioned at one end thereof to a terminal 164b positioned at the other end. A line width and a line-to-line spacing of the outer-peripheral heater electrode 162 are narrower than those of the central heater electrode 164. Looking at the heater electrodes 162 and 164 in a vertical cross-section, each of those heater electrodes has a structure in which multiple resistance heating layers are laminated. The terminals 162a and 162b are each connected to a feeder rod, not illustrated, which extends from the lower surface of the plate 12 downward through the cooling plate 20, and those terminals are further connected to an outer-peripheral heater power supply, not illustrated, via the feeder rod. The terminals 164a and 164b are each connected to a feeder rod, not illustrated, which extends from the lower surface of the plate 12 downward through the cooling plate 20, and those terminals are further connected to a central heater power supply, not illustrated, via the feeder rod. The above-mentioned feeder rods are electrically insulated from the cooling plate 20.

The cooling plate 20 is bonded to a rear surface of the plate 12 with a bonding layer 18 made of a silicone resin interposed therebetween. The cooling plate 20 is made of metal (for example, aluminum) and includes a built-in coolant passage 22 allowing a coolant (for example, water) to flow therethrough. The coolant passage 22 is formed such that the coolant flows over an entire surface of the plate 12. The coolant passage 22 is provided with a supply port and a discharge port (both not illustrated) for the coolant.

The multiple through-holes 24 penetrate through the plate 12, the bonding layer 18, and the cooling plate 20 in a thickness direction thereof. The electrostatic electrode 14 and the heater electrode 16 are designed not to be exposed to inner peripheral surfaces of the through-holes 24. In this embodiment, the through-holes 24 are each a pin hole through which a lift pin, not illustrated, is to be inserted in a vertically movable manner. The lift pin is selectively positioned at one of a retracted position at which the lift pin is retracted downward below the upper surface of the plate 12 and a projected position at which the lift pin is projected upward above the upper surface of the plate 12. When the lift pin is ascended from the retracted position to the projected position, the wafer W placed on the upper surface of the plate 12 is raised above the upper surface of the plate 12. An insulation pipe 26 is inserted to span over a cooling-plate penetration portion of each through-hole 24, the portion penetrating through the cooling plate 20. The insulation pipe 26 is a member obtained by forming an insulating material, for example, alumina, into a pipe-like shape.

The central heater electrode 164 is now described in more detail. As illustrated in FIG. 3, the central heater electrode 164 is wired to surround three through-holes 24. A distance between a peripheral edge of each of the through-holes 24 and a portion of the central heater electrode 164 closest to the through-hole 24 is set to, for example, 0.1 to 5 mm, and temperature of the plate 12 becomes low in a region of the plate 12 where the through-hole 24 is formed. In consideration of such a point, the through-hole 24 is regarded here as a specific temperature area T1. Around the specific temperature area T1, a specific area surrounding portion S1 generating a larger amount of heat than a normal portion N is disposed to surround the specific temperature area T1. Here, of the central heater electrode 164, part closest to the specific temperature area T1 is called a first resistance heating line portion 81, part second closest to the specific temperature area T1 is called a second resistance heating line portion 82, and part third closest to the specific temperature area T1 is called a third resistance heating line portion 83. The specific area surrounding portion S1 is formed of a region consisting of a collection of multiple small regions (three small regions, namely first to third small regions S11 to S13, in this embodiment). As illustrated in FIG. 3, when a first round shape line, specifically, a first circle C1 with the through-hole 24 being a center, is drawn, the first small region S11 is a region of the first resistance heating line portion 81, the region included within the first circle C1. When a second round shape line, specifically, a second circle C2 with the through-hole 24 being a center and with a larger size than the first circle C1, is drawn, the second small region S12 is a region of the second resistance heating line portion 82, the region included within the second circle C2. When a third round shape line, specifically, a third circle C3 with the through-hole 24 being a center and with a larger size than the first circle C1 and the second circle C2, is drawn, the third small region S13 is a region of the third resistance heating line portion 83, the region included within the third circle C3. Of the central heater electrode 164, widths of the heater electrodes in the first to third small regions S11 to S13 constituting the specific area surrounding portion S1 are the same as those of the normal portions N in the first to third resistance heating line portions 81 to 83.

As illustrated in FIG. 4, of the central heater electrode 164, the first to third small regions S11 to S13 constituting the specific area surrounding portion S1 are each constituted by three resistance heating layers L1 to L3. On the other hand, as illustrated in FIG. 5, the normal portion N of the central heater electrode 164 is constituted by four resistance heating layers L1 to L4. Thus, in the specific area surrounding portion S1, the central heater electrode 164 has a smaller thickness than in the normal portion N. In the specific area surrounding portion S1, therefore, a cross-sectional area is reduced in comparison with the normal portion N and resistance is increased in comparison with the normal portion N. As a result, the specific area surrounding portion S1 generates a larger amount of heat than the normal portion N when a voltage is applied between the terminal 164a and the terminal 164b.

In a region where the terminal 164a and the terminal 164b are positioned opposite to each other, the heater electrode is not wired and hence the temperature of the plate 12 becomes low. The temperature of the plate 12 is more apt to be low especially at a midpoint M of a segment connecting the terminal 164a and the terminal 164b. In consideration of such a point, the midpoint M is regarded here as a specific temperature area T2. Around the specific temperature area T2, a specific area surrounding portion S2 generating a larger amount of heat than the normal portion N is disposed to surround the specific temperature area T2. Here, of the central heater electrode 164, parts closest to the midpoint M and extending from the terminal 164a and the terminal 164b in directions oppositely away from the midpoint M are each called a first resistance heating line portion 91. Of the central heater electrode 164 and the outer-peripheral heater electrode 162, parts disposed around the pair of terminal 164a and terminal 164b and positioned second closest to the midpoint M are each called a second resistance heating line portion 92, and parts third closest to the midpoint M are each called a third resistance heating line portion 93. The specific area surrounding portion S2 is formed of a region consisting of a collection of multiple small regions (three small regions, namely first to third small regions S21 to S23, in this embodiment). As illustrated in FIG. 3, when a first round shape line, specifically, a first ellipse E1 with the midpoint M being a center, is drawn, the first small region S21 is a region of the first resistance heating line portion 91, the region included within the first ellipse E1. When a second round shape line, specifically, a second ellipse E2 with the midpoint M being a center and with a larger size than the first ellipse E1, is drawn, the second small region S22 is a region of the second resistance heating line portion 92, the region included within the second ellipse E2. When a third round shape line, specifically, a third ellipse E3 with the midpoint M being a center and with a larger size than the first ellipse E1 and the second ellipse E2, is drawn, the third small region S23 is a region of the third resistance heating line portion 93, the region included within the third ellipse E3. Of the central heater electrode 164 and the outer-peripheral heater electrode 162, the heater electrodes in the first to third small regions S21 to S23 constituting the specific area surrounding portion S2 have the same widths as the normal portions N in the first to third resistance heating line portions 91 to 93.

Of the central heater electrode 164 and the outer-peripheral heater electrode 162, the first to third small regions S21 to S23 constituting the specific area surrounding portion S2 are each constituted by the three resistance heating layers L1 to L3. The normal portions N of the central heater electrode 164 and the outer-peripheral heater electrode 162 are each constituted by the four resistance heating layers L1 to L4. Thus, in the specific area surrounding portion S2, each of the central heater electrode 164 and the outer-peripheral heater electrode 162 has a smaller thickness than in the normal portion N. In the specific area surrounding portion S2, therefore, a cross-sectional area is reduced in comparison with the normal portion N and resistance is increased in comparison with the normal portion N. As a result, the specific area surrounding portion S2 generates a larger amount of heat than the normal portion N when voltages are applied between the terminal 164a and the terminal 164b and between the terminal 162a and the terminal 162b.

An example of use of the electrostatic chuck heater 10 according to this embodiment will be described below. The wafer W is placed on the surface of the plate 12 in the electrostatic chuck heater 10 and a voltage is applied between the electrostatic electrode 14 and the wafer W, thus attracting the wafer W to the plate 12 by electrostatic force. In such a state, plasma CVD film formation or plasma etching is performed on the wafer W. Furthermore, temperature of the wafer W is controlled to be held constant by applying a voltage to the heater electrode 16 to heat the wafer W, or by circulating the coolant through the coolant passage 22 in the cooling plate 20 to cool the wafer W. When applying the voltage to the heater electrode 16, voltages are applied between the terminal 162a and the terminal 162b and between the terminal 164a and the terminal 164b. With the application of the voltages, the outer-peripheral heater electrode 162 and the central heater electrode 164 generate heat, thereby heating the wafer W. The line width and the line-to-line spacing of the outer-peripheral heater electrode 162 are narrower than those of the central heater electrode 164. Accordingly, the amount of heat generation is larger on an outer peripheral side than on a central side. Such a design is based on a consideration that, on the outer peripheral side of the plate 12, heat dissipates from a lateral surface as well and hence temperature is more apt to be low than on the central side. Furthermore, of the central heater electrode 164, the specific area surrounding portion S1 surrounding the specific temperature area T1 (the through-hole 24) has larger resistance than the normal portion N. Accordingly, the amount of heat generated from the central heater electrode 164 is larger in the specific area surrounding portion S1 than in the normal portion N. Such a design is based on a consideration that the central heater electrode 164 cannot be formed in the through-hole 24 and hence temperature is more apt to be low in the region of the plate 12 where the through-hole 24 is formed. Moreover, of the central heater electrode 164 and the outer-peripheral heater electrode 162, the specific area surrounding portion S2 surrounding the specific temperature area T2 (the midpoint M) has larger resistance than the normal portion N. Accordingly, the amount of heat generated from each of the central heater electrode 164 and the outer-peripheral heater electrode 162 is larger in the specific area surrounding portion S2 than in the normal portion N. After the end of processing on the wafer W, the voltage applied between the electrostatic electrode 14 and the wafer W is returned to zero to eliminate the electrostatic force, and the lift pin (not illustrated) inserted into the through-hole 24 is pushed up to raise the lift pin upward from the surface of the plate 12. Thereafter, the wafer W having been raised by the lift pin is carried to another place by a carrying device (not illustrated).

Procedures of manufacturing the plate 12 of the electrostatic chuck heater 10 will be described below. FIGS. 6A to 6D illustrate manufacturing processes for the plate 12.

Figure 6A:
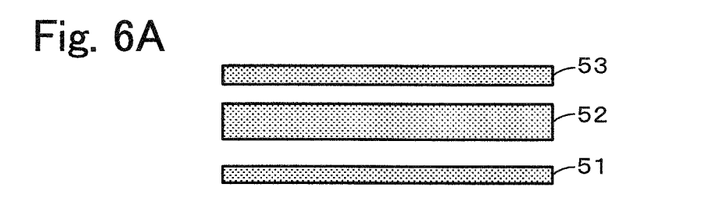
FIGS. 6A to 6D illustrate manufacturing processes for a plate 12.

(a) Fabrication of Compacts (See FIG. 6A)

First to third compacts 51 to 53 are fabricated. The compacts 51 to 53 are each fabricated by first putting, into a mold, alumina powder, magnesium fluoride as a sintering aid, a solvent, a dispersant, and a slurry containing a gelling agent, causing the gelling agent to develop a chemical reaction in the mold to gel the slurry, and then releasing the gelled slurry from the mold.

The solvent is not limited to a specific one insofar as being able to dissolve the dispersant and the gelling agent. The solvent may be, for example, a hydrocarbon solvent (such as toluene, xylene, or solvent naphtha), an ether solvent (such as ethylene glycol monoethylene ether, butyl carbitol, or butyl carbitol acetate), an alcohol solvent (such as isopropanol, 1-butanol, ethanol, 2-ethyl hexanol, terpineol, ethylene glycol, or glycerin), a ketone solvent (such as acetone or methyl ethyl ketone), an ester solvent (such as butyl acetate, dimethyl glutarate, or triacetin), or a polybasic acid solvent (such as glutaric acid). In particular, a solvent with two or more ester bonds, such as a polybasic acid ester (for example, dimethyl glutarate) or an acid ester of polyhydric alcohol (for example, triacetin), is preferably used.

The dispersant is not limited to a specific one insofar as being able to uniformly disperse the alumina powder into the solvent. The dispersant may be, for example, a polycarboxylate copolymer, a polycarboxylate, a sorbitan fatty acid ester, a polyglycerol fatty acid ester, a phosphate ester salt copolymer, a sulfonate copolymer, and a polyurethane polyester copolymer with tertiary amine. In particular, for example, the polycarboxylate copolymer or the polycarboxylate is preferably used. Adding that dispersant enables the slurry before being molded to have low viscosity and high fluidity.

The gelling agent may be, for example, an agent containing isocyanate, polyol, and a catalyst. Among them, the isocyanate is not limited to a specific one insofar as a material to be used has an isocyanate group as a functional group. The isocyanate may be, for example, tolylene diisocyanate (TDI), diphenylmethane diisocyanate (MDI), and a modified product thereof. A molecule of the material to be used may contain a reactive functional group other than the isocyanate group or may contain many reactive functional groups like polyisocyanate. The polyol is not limited to a specific one insofar as the material to be used contains two or more hydroxide groups capable of reacting with the isocyanate group. The polyol may be, for example, ethylene glycol (EG), polyethylene glycol (PEG), propylene glycol (PG), polypropylene glycol (PPG), polytetramethylene glycol (PTMG), polyhexamethylene glycol (PHMG), and polyvinyl alcohol (PVA). The catalyst is not limited to a specific one insofar as the material to be used promotes a urethane reaction with the isocyanate and the polyol. The catalyst may be, for example, triethylenediamine, hexanediamine, or 6-dimethylamino-1-hexanol.

In this step (a), preferably a slurry precursor is first prepared by adding the solvent and the dispersant to the alumina powder and magnesium fluoride powder at predetermined ratios and by mixing them for a predetermined time, and the slurry is then obtained by adding the gelling agent to the slurry precursor, mixing them, and by carrying out vacuum defoaming. A mixing method used in preparing the slurry precursor and the slurry is not limited to a specific one and can be performed by utilizing, for example, a ball mill, rotation and revolution stirring, vibration stirring, or propeller stirring. Because the slurry after adding the gelling agent to the slurry precursor initiates the chemical reaction (urethane reaction) of the gelling agent with the lapse of time, it is preferable to quickly pour the slurry into the mold. The slurry poured into the mold is gelled with the progress of the chemical reaction of the gelling agent contained in the slurry. The term "chemical reaction of the gelling agent" implies a reaction in which the isocyanate and the polyol develop the urethane reaction and come into a urethane resin (polyurethane). The slurry is gelled with the reaction of the gelling agent, and the urethane resin functions as an organic binder.

Figure 6B:
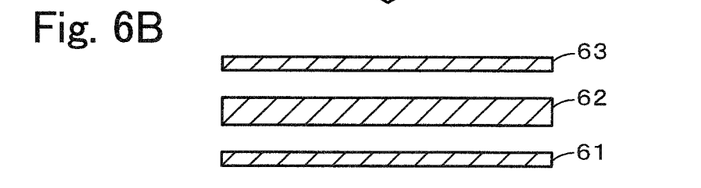

(b) Fabrication of Calcined Body (See FIG. 6B)

First to third calcined bodies 61 to 63 are obtained by drying, then defatting, and further calcining the first to third compacts 51 to 53. The first to third compacts 51 to 53 are dried to vaporize the solvent contained in the first to third compacts 51 to 53. A drying temperature and a drying time may be set as appropriate depending on the solvent used. However, the drying temperature should be carefully set to avoid the first to third compacts 51 to 53 from being cracked during the drying. An atmosphere for the drying may be any of an air atmosphere, an inert atmosphere, and a vacuum atmosphere. The defatting of the compacts 51 to 53 after the drying is made to decompose and remove organic materials such as the dispersant, the catalyst, and the binder. A defatting temperature may be set as appropriate depending on the types of the organic materials contained in the compacts and may be set to, for example, 400 to 600° C. An atmosphere for the defatting may be any of the air atmosphere, the inert atmosphere, and the vacuum atmosphere. The calcining of the compacts 51 to 53 after the defatting is made to increase strength of the compacts for more convenience in handling. A calcining temperature is not limited to a specific value and may be set to, for example, 750 to 900° C. An atmosphere for the calcining may be any of the air atmosphere, the inert atmosphere, and the vacuum atmosphere.

Figure 6C:
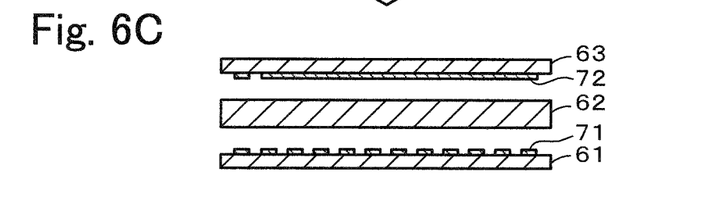

(c) Printing of Electrode Paste (See FIG. 6C)

A heater electrode paste 71 is printed on one surface of the first calcined body 61 by screen printing, and an electrostatic electrode paste 72 is printed on one surface of the third calcined body 63 by the screen printing. Each of the pastes 71 and 72 contains alumina ceramic powder, molybdenum powder, titanium powder, a binder, and a solvent. The binder may be, for example, a cellulose binder (such as ethyl cellulose), an acrylic binder (such as methyl polymethacrylate), or a vinyl binder (such as polyvinyl butyral). The solvent may be, for example, terpineol. The screen printing is one example of a printing method.

When printing the heater electrode paste 71, at first, a mask punched out to have a pattern of the same shape as a wiring pattern of the heater electrode 16 is prepared and the heater electrode paste 71 is printed with the mask placed on one surface of the first calcined body 61. The printing of the heater electrode paste 71 to form the resistance heating layers L1 to L3 is completed by repeating the above-mentioned work. Then, the heater electrode paste 71 is printed after replacing the above-mentioned mask with a mask which is punched out to have the pattern of the same shape as the wiring pattern of the heater electrode 16, but in which the specific area surrounding portions S1 and S2 are not punched out. As a result, in the specific area surrounding portions S1 and S2, the heater electrode paste 71 forming the resistance heating layers L1 to L3 is printed while the heater electrode paste 71 forming the resistance heating layer L4 is not printed. On the other hand, in the normal portion N, the heater electrode paste 71 forming the resistance heating layers L1 to L4 is printed.

Figure 6D:
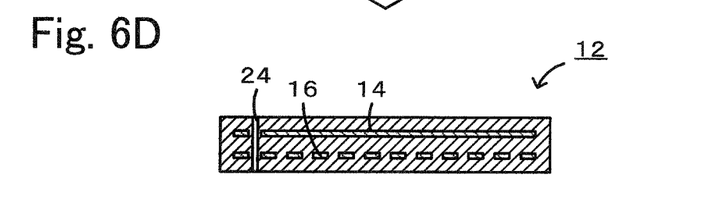

(d) Hot-Press Firing (See FIG. 6D)

The first calcined body 61 and the second calcined body 62 are placed one above the other with the printed heater electrode paste 71 interposed therebetween, and the second calcined body 62 and the third calcined body 63 are placed one above the other with the printed electrostatic electrode paste 72 interposed therebetween. Hot-press firing is performed in such a multilayered state. As a result, the heater electrode paste 71 is fired to form the heater electrode 16, the electrostatic electrode paste 72 is fired to form the electrostatic electrode 14, and the calcined bodies 61 to 63 are fired and integrated into an alumina ceramic base body. Thereafter, grinding or blasting is performed on the alumina ceramic base body for adjustment into a desired shape and thickness, and the through-holes 24 are formed by machining the alumina ceramic base body. Thus, the plate 12 is obtained. In the hot-press firing, a press pressure is preferably set to 30 to 300 kgf/cm² and more preferably to 50 to 250 kgf/cm² at least at a maximum temperature (firing temperature). Because the magnesium fluoride is added to the alumina powder, the maximum temperature may be set to a lower temperature (1120 to 1300° C.) than in the case in which the magnesium fluoride is not added. An atmosphere for the firing may be selected as appropriate from the air atmosphere, the inert atmosphere, and the vacuum atmosphere.

In the above-described electrostatic chuck heater 10 according to this embodiment, of the heater electrode 16, the specific area surrounding portions S1 and S2 surrounding the specific temperature areas T1 and T2 in which the temperature of the plate 12 becomes low have smaller thicknesses than the normal portion N of the heater electrode 16. In other words, the specific area surrounding portions S1 and S2 have smaller cross-sectional areas and larger resistances than the normal portion N of the heater electrode. Therefore, the amount of heat generated when the voltage is applied between the terminals of the heater electrode 16 is larger in the specific area surrounding portions S1 and S2 than in the normal portion N, and hence a reduction of the temperature in the specific temperature areas T1 and T2 can be suppressed. As a result, soaking design for the specific temperature areas T1 and T2 of the plate 12 can be facilitated.

Furthermore, in the electrostatic chuck heater 10, the width of the heater electrode 16 in each of the specific area surrounding portions S1 and S2 is equal to that of the normal portion N of the heater electrode 16. As a result, wiring of the heater electrode 16 can be relatively easily designed.

In the electrostatic chuck heater 10, the specific temperature area T1 is the through-hole 24 penetrating through the plate 12, and the central heater electrode 164 includes the first to third resistance heating line portions 81 to 83 that are wired to surround the through-hole 24. Assuming that three round shape lines centered at the through-hole 24 with different sizes are drawn and part of one of the first to third resistance heating line portions 81 to 83 which is k-th (k is an integer of 1 or more and 3 or less) closest to the through-hole 24, the part being included within the k-th smallest round shape line, is defined as a k-th small region, the specific area surrounding portion S1 is formed of a region consisting of a collection of the first to third small regions S11 to S13. Therefore, the specific area surrounding portion S1 can locally generate a larger amount of heat than the normal portion N.

In the electrostatic chuck heater 10, the specific temperature area T2 is the midpoint M of the segment connecting the pair of terminals of the heater electrode 16, the terminals being arranged oppositely apart from each other, and the heater electrode 16 includes the multiple resistance heating line portions 91 to 93. The first resistance heating line portion 91 extends from each of the pair of terminals in opposite directions. The second and third resistance heating line portions 92 and 93 are disposed around the pair of terminals. Assuming that three round shape lines with different sizes centered at the midpoint M are drawn and part of one of the first to third resistance heating line portions 91 to 93 which is k-th (k is an integer of 1 or more and 3 or less) closest to the midpoint M, the part being included within the k-th smallest round shape line, is defined as a k-th small region, the specific area surrounding portion S2 is formed of a region consisting of a collection of the first to third small regions S21 to S23. Therefore, the specific area surrounding portion S2 can locally generate a larger amount of heat than the normal portion N.

In the electrostatic chuck heater 10, the round shape line is a true circle or an ellipse. Because the round shape line has a relatively simple shape, the specific area surrounding portions S1 and S2 can be relatively easily formed.

In the electrostatic chuck heater 10, the heater electrode 16 has the structure in which the multiple resistance heating layers are laminated, and the number of the laminated resistance heating layers is smaller in the specific area surrounding portions S1 and S2 than in the normal portion N. Accordingly, the specific area surrounding portions S1 and S2 can be relatively easily fabricated.

It is needless to say that the present invention is not limited to the above-described embodiment and can be implemented in various forms insofar as falling within the technical scope of the present invention.

Figure 7:
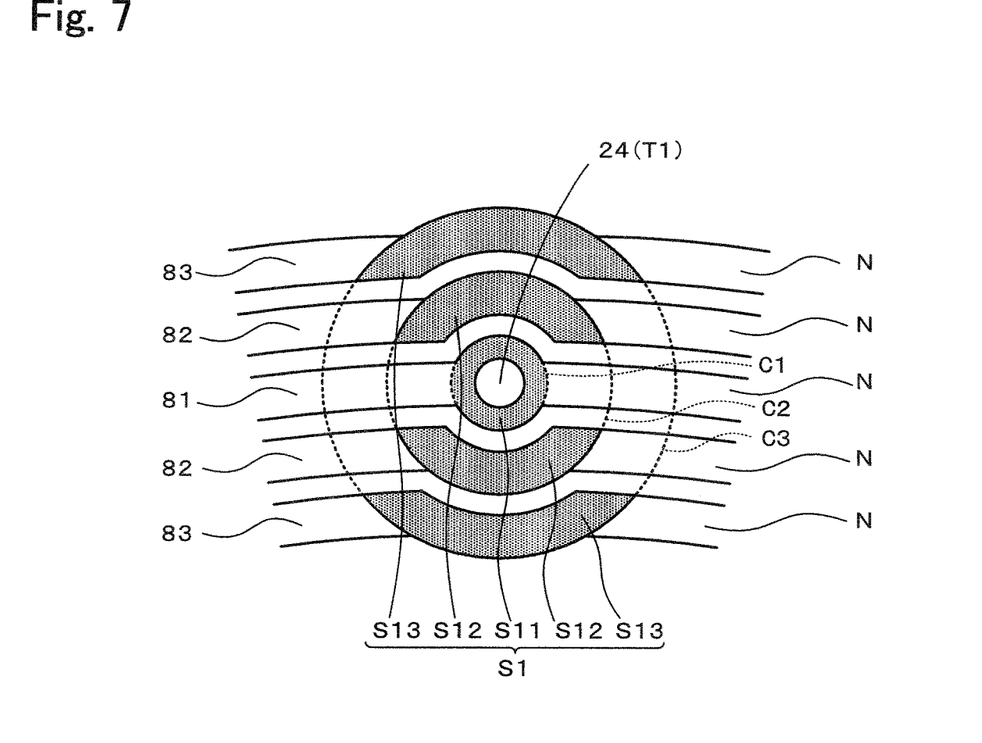
FIG. 7 is an explanatory view illustrating a modification of wiring layouts of first to third resistance heating line portions 81 to 83.

For example, while, in the above-described embodiment, the first resistance heating line portion 81 has the shape bypassing the through-hole 24 on an outer side relative to a center of the plate 12, the present invention is not limited to that embodiment. As illustrated in FIG. 7, for example, the first resistance heating line portion 81 may have a shape passing the through-hole 24 on both outer and inner sides relative to the center of the plate 12 and then joining together again. In FIG. 7, the same constituent elements as those in FIG. 3 are denoted by the same reference signs and description of those constituent elements is omitted.

Figure 8:
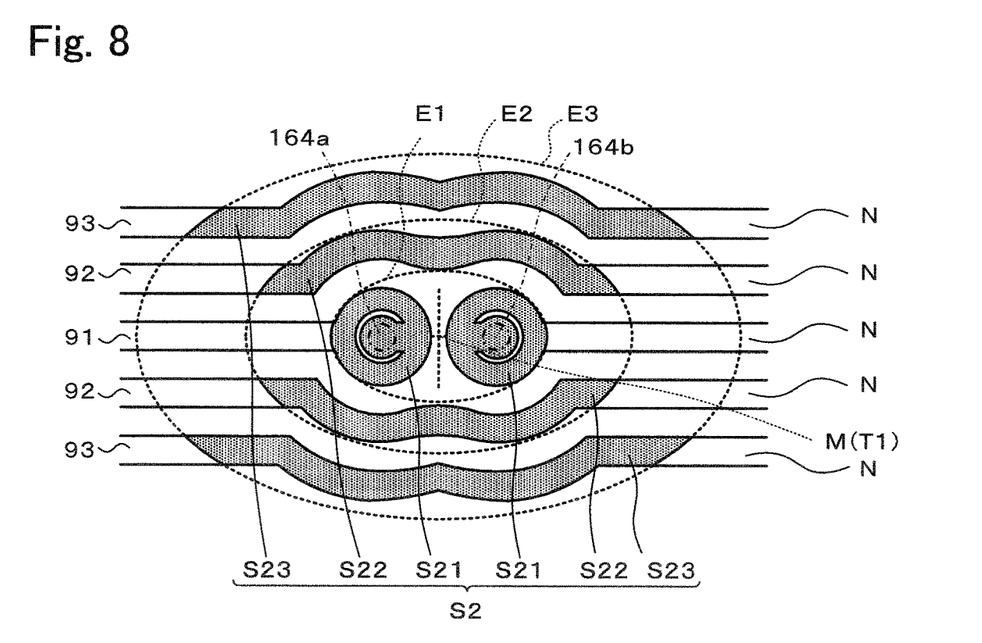
FIG. 8 is an explanatory view illustrating a modification of wiring layouts of first to third resistance heating line portions 91 to 93.

While, in the above-described embodiment, the first resistance heating line portion 91 extends from each of the terminals 164a and 164b in the opposite directions with respect to the midpoint M, the present invention is not limited to that embodiment. As illustrated in FIG. 8, for example, the first resistance heating line portion 91 may have a shape extending from each of the terminals 164a and 164b toward the midpoint M and split into two parts, these split parts of the first resistance heating line portion 91 extending half around the terminals 164a and 164b in a one-to-one relationship and then joining together again on sides opposite to the midpoint M. In such a case, as illustrated in FIG. 8, each of the second and third resistance heating line portions 92 and 93 may have a shape bypassing the terminals 164a and 164b while following the shape of the first resistance heating line portion 91. In FIG. 8, the same constituent elements as those in FIG. 3 are denoted by the same reference signs and description of those constituent elements is omitted.

Figure 9:
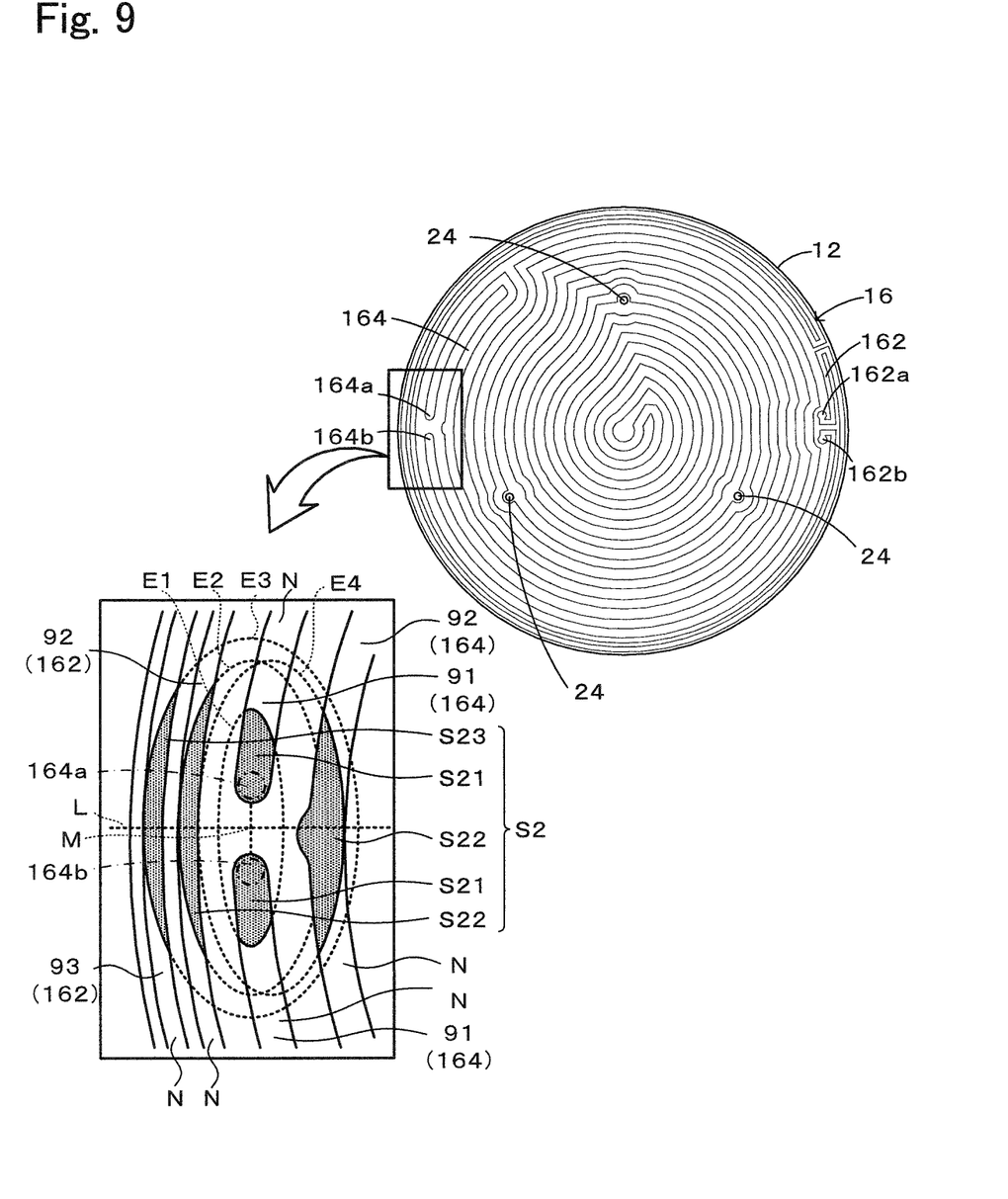
FIG. 9 is an explanatory view illustrating a modification of a specific area surrounding portion S2.

While, in the above-described embodiment, the second small region S22 constituting the specific area surrounding portion S2 is given as a region of the second resistance heating line portion 92, the region being included in one second ellipse E2, the present invention is not limited to that embodiment. As illustrated in FIG. 9, for example, the second small region S22 constituting the specific area surrounding portion S2 may be given as a region of the second resistance heating line portion 92, the region being included in not only the second ellipse E2, but also in a fourth ellipse E4 with a center positioned on a line L passing the midpoint M and being perpendicular to the segment connecting the terminals and with the same size as the second ellipse E2. In FIG. 9, the same constituent elements as those in FIG. 3 are denoted by the same reference signs and description of those constituent elements is omitted.

Figure 10:
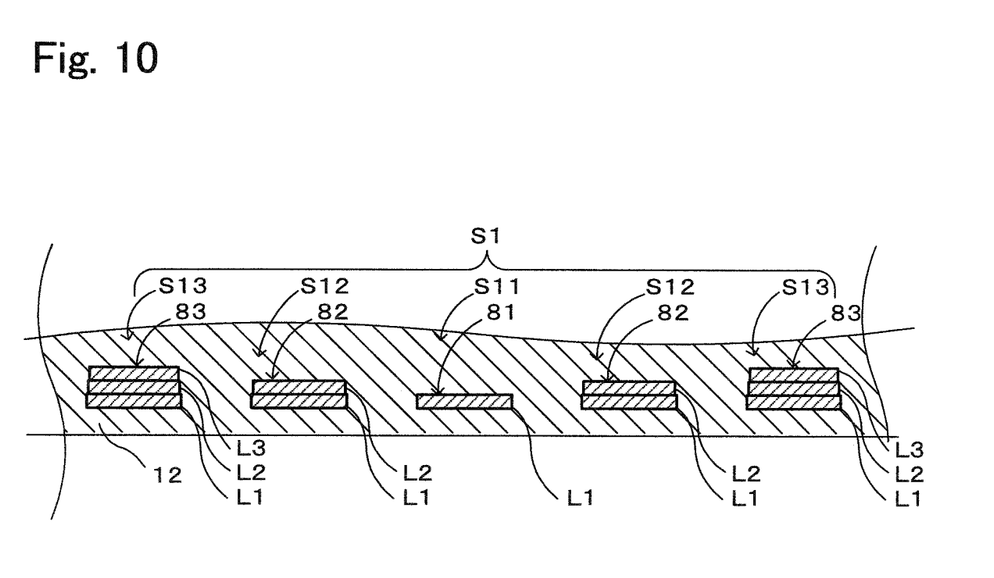
FIG. 10 is a sectional view illustrating a modification of a specific area surrounding portion S1.

While, in the above-described embodiment, the heater electrode 16 has the same thickness in the first to third small regions S11 to S13 of the specific area surrounding portion S1, the present invention is not limited to that embodiment. As illustrated in FIG. 10, for example, in the first to third small regions S11 to S13 of the specific area surrounding portion S1, the second small region S12 may have a smaller thickness than the third small region S13, and the first small region S11 may have a smaller thickness than the second small region S12. In such a case, the amount of heat generation in a region of the specific area surrounding portion S1 farther away from the specific temperature area T1 is smaller than that in a region of the specific area surrounding portion S1 nearer to the specific temperature area T1. Therefore, the soaking design can be further facilitated. Moreover, in the first to third small regions S21 to S23 of the specific area surrounding portion S2, the second small region S22 may have a smaller thickness than the third small region S23, and the first small region S21 may have a smaller thickness than the second small region S22. In FIG. 10, the same constituent elements as those in FIG. 4 are denoted by the same reference signs and description of those constituent elements is omitted.

Figure 11:
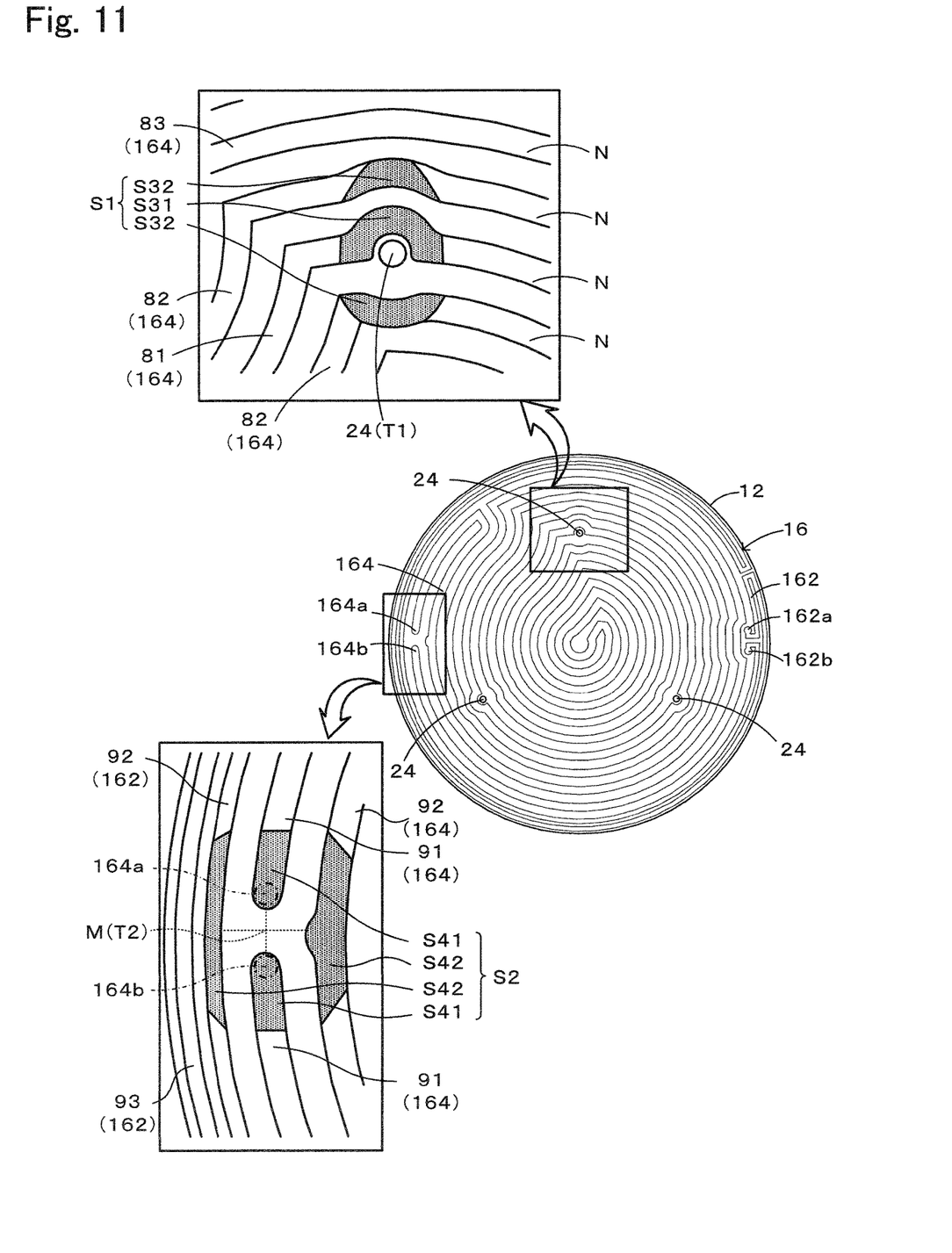
FIG. 11 is an explanatory view illustrating modifications of the specific area surrounding portions S1 and S2.

While, in the above-described embodiment, the specific area surrounding portion S1 consists of a collection of the first to third small regions S11 to S13 that are set based on the first to third circles C1 to C3 drawn centered at the through-hole 24. Furthermore, in the above-described embodiment, the specific area surrounding portion S2 consists of a collection of the first to third small regions S21 to S23 that are set based on the first to third ellipses E1 to E3 drawn centered at the midpoint M. However, the specific area surrounding portions S1 and S2 are not limited to those ones. For example, the specific area surrounding portion S1 may consist of a collection of first to third small regions S11 to S13 that are set based on multiple oblong circles or ellipses drawn centered at the through-hole 24, and the specific area surrounding portion S2 may consist of a collection of first to third small regions S21 to S23 that are set based on multiple true circles or oblong circles drawn centered at the midpoint M. Instead, as illustrated in FIG. 11, the specific area surrounding portion S1 may consist of a collection of first and second small regions S31 and S32 of the first to third resistance heating line portion 81 to 83, those small regions S31 and S32 being optionally set to surround the through-hole 24 such that the temperature of the plate 12 becomes uniform. The specific area surrounding portion S2 may consist of a collection of first and second small regions S41 and S42 of the first to third resistance heating line portion 91 to 93, those small regions S41 and S42 being optionally set to surround the midpoint M such that the temperature of the plate 12 becomes uniform. In FIG. 11, the same constituent elements as those in FIG. 3 are denoted by the same reference signs and description of those constituent elements is omitted.

Figure 12:
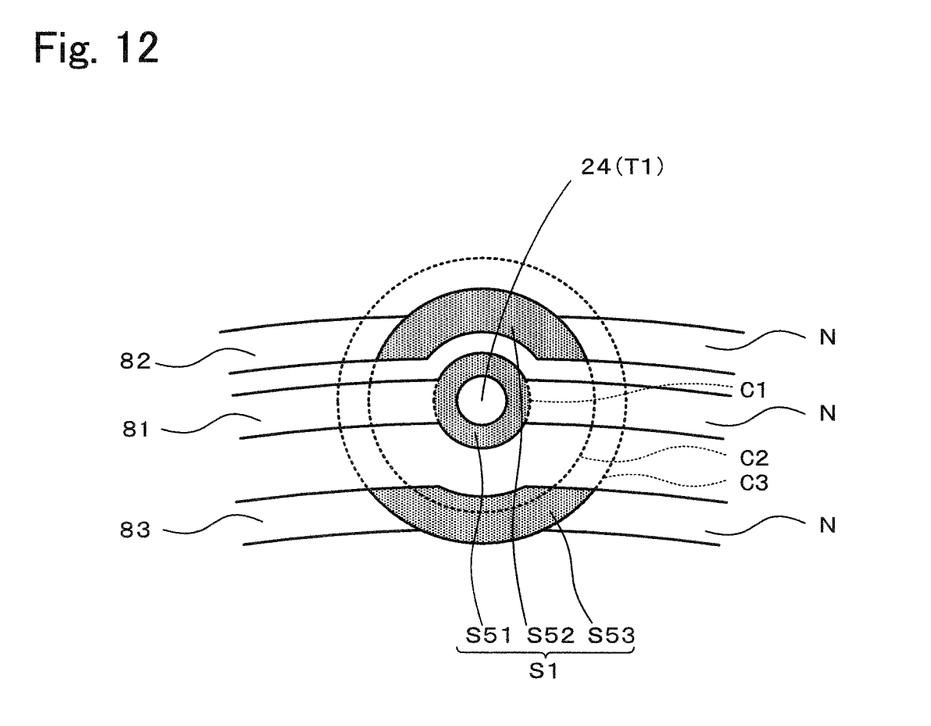
FIG. 12 is an explanatory view illustrating a modification of the specific area surrounding portion S1.

While, in the above-described embodiment, the first to third resistance heating line portion 81 to 83 are wired at the equal spacing, the present invention is not limited to that embodiment. As illustrated in FIG. 12, for example, two resistance heating line portions may be disposed adjacent to the first resistance heating line portion 81 at different distances from the first resistance heating line portion 81. As in the above-described embodiments, the resistance heating line portion second closest to the specific temperature area T1 (namely, one of the two resistance heating line portions closer to the first resistance heating line portion) is the second resistance heating line portion 82, and the resistance heating line portion third closest to the specific temperature area T1 (namely, the other of the two resistance heating line portions farther away from the first resistance heating line portion) is the third resistance heating line portion 83. In such a case, the specific area surrounding portion S1 is formed of a region consisting of a collection of three small regions, namely first to third small regions S51 to S53. When a first circle C1 centered at the through-hole 24 is drawn, the first small region S51 is part of the first resistance heating line portion 81, the part being included within the first circle C1. When a second circle C2 centered at the through-hole 24 is drawn, the second small region S52 is part of the second resistance heating line portion 82, the part being included within the second circle C2. When a third circle C3 centered at the through-hole 24 is drawn, the third small region S53 is part of the third resistance heating line portion 83, the part being included within the third circle C3. In FIG. 12, the same constituent elements as those in FIG. 3 are denoted by the same reference signs and description of those constituent elements is omitted.

In the above-described embodiment, by way of example, the plate 12 is divided into two zones, namely an outer peripheral zone and a central zone, and the heater electrode 16 is disposed for each of the zones (namely, the outer-peripheral heater electrode 162 and the central heater electrode 164 are disposed). However, the heater electrode 16 may be disposed over the entirety of the plate 12 without dividing the plate 12 into two zones. Instead, the plate 12 may be divided into three or more zones, and the heater electrode 16 may be disposed for each of those zones.

While, in the above-described embodiment, the through-hole 24 is used, by way of example, as the pin hole through which the lift pin is to be inserted, the through-hole 24 is not particularly limited to the pin hole. For example, the through-hole 24 may be a gas supply hole through which cooling gas is to be supplied to the rear surface of the wafer W placed on the upper surface of the plate 12, thereby cooling the wafer W.

While, in the above-described embodiment, the heater electrode paste 71 and the electrostatic electrode paste 72 are applied by the screen printing, the present invention is not particularly limited to that embodiment. For example, PVD, CVD, or plating may be used instead of the screen printing.

While, in the above-described embodiment, the plate 12 is fabricated by the manufacturing method illustrated in FIGS. 6A to 6D, the present invention is not particularly limited to that embodiment. As an example, while, in the above-described embodiment, the first to third compacts 51 to 53 are each fabricated by gelling the slurry, the first to third compacts 51 to 53 may be each fabricated by laminating green sheets. As another example, the step of calcining the first to third compacts 51 to 53 may be omitted. In such a case, after printing the heater electrode paste 71 on the first compact 51 and printing the electrostatic electrode paste 72 on the third compact 53, the first to third compacts 51 to 53 may be subjected to the hot-press firing. As a still another example, the plate 12 may be fabricated by putting a first compact, which has been obtained by firing the first calcined body 61 and on which the heater electrode paste 71 has been printed, into a mold with a paste-printed surface facing upward, by putting ceramic granulation granules onto the first compact to form a granule layer with a predetermined thickness, by placing a third compact, which has been obtained by firing the third calcined body 63 and on which the electrostatic electrode paste 72 has been printed, on the granule layer with a paste-printed surface facing downward, and by performing the hot-press firing while the above-mentioned layered compacts are pressed from above and below the mold.

While, in the above-described embodiment, the specific area surrounding portions S1 and S2 consist of collections of the first to third small regions S11 to S13 and S21 to S23, respectively, the present invention is not limited to that embodiment. For example, each of the specific area surrounding portions S1 and S2 may consist of a collection of two small regions or a collection of four or more small regions.

While, in the above-described embodiment, the midpoint M is regarded as the specific temperature area T2, a midpoint of a segment connecting the terminals 162a and 162b may be regarded a specific temperature area in addition to or instead of the midpoint M, and a specific area surrounding portion may be formed in a similar manner to the specific area surrounding portion S1 or S2.

While, in the above-described embodiment, the first to third small regions S11 to S13 and S21 to S23 have the same widths as the normal portions N, the present invention is not limited to that embodiment. For example, the first to third small regions S11 to S13 and S21 to S23 may have smaller widths or larger widths than the normal portions N.

In the above-described embodiment, the thickness of the heater electrode 16 in each of the specific area surrounding portions S1 and S2 is reduced by, after printing the heater electrode paste 71 forming each of the resistance heating layers L1 to L3, not printing the heater electrode paste 71 forming the resistance heating layer L4 in each of the specific area surrounding portions S1 and S2 with use of the mask in which the specific area surrounding portions S1 and S2 are not punched out. However, the present invention is not limited to that embodiment. For example, the thickness of the heater electrode 16 in each of the specific area surrounding portions S1 and S2 may be reduced by, after printing the heater electrode paste 71 forming each of the resistance heating layers L1 to L4 with use of the mask punched out to have the pattern of the same shape as the wiring pattern of the heater electrode 16, performing laser trimming to remove the resistance heating layer L4.

While, in the above-described embodiment, the vertical cross-sectional surface of the heater electrode 16 has the structure in which the multiple resistance heating layers are laminated, the multiple resistance heating layers may be replaced with a single resistance heating layer. In such a case as well, the thickness of the heater electrode 16 is set to be smaller in each of the specific area surrounding portions S1 and S2 than in the normal portion N. The single resistance heating layer may be fabricated by firing a single resistance heating raw-material layer, or by firing a laminate of multiple resistance heating raw-material layers such that the individual resistance heating raw-material layers are mixed and integrated together (into a single layer).

The present application claims priority from Japanese Patent Application No. 2020-167627, filed on Oct. 2, 2020, the entire contents of which are incorporated herein by reference.

What is claimed is:

1. A ceramic heater including a heater electrode embedded in a plate made of ceramic,
   wherein, of the heater electrode, a specific area surrounding portion surrounding a specific temperature area in which temperature of the plate becomes low has a smaller thickness than a normal portion of the heater electrode,
   wherein the specific temperature area is a midpoint of a segment connecting a pair of terminals of the heater electrode, the terminals being arranged oppositely apart from each other,
   the heater electrode includes multiple resistance heating line portions, the multiple resistance heating line portions including a resistance heating line portion that extends from each of the pair of terminals in opposite directions and one or more resistance heating line portions that are disposed around the pair of terminals, and
   assuming that a number n (n is an integer of two or more) of round shape lines centered at the midpoint with different sizes are drawn and part of one of the multiple resistance heating line portions which is k-th (k is an integer of 1 or more and n or less) closest to the midpoint, the part being included within the k-th smallest round shape line, is defined as a k-th small region, the specific area surrounding portion is formed of a region consisting of a collection of the first to n-th small regions, wherein an m-th (m is an integer of 1 or more and (n−1) or less) small region of the specific area surrounding portion is thinner than an (m+1)-th small region; and wherein the round shape lines centered at the midpoint formed from the multiple resistance heating line portions of the heater electrode are in the shape of an ellipse, or an oblong circle in the specific area surrounding portion of the specific temperature area.

2. The ceramic heater according to claim 1, wherein the normal portion of the heater electrode is a portion adjacent to the specific area surrounding portion.

3. The ceramic heater according to claim 1, wherein a width of the heater electrode in the specific area surrounding portion is equal to a width of the heater electrode in the normal portion.

4. The ceramic heater according to claim 1, wherein the heater electrode has a structure in which multiple resistance heating layers are laminated, and the number of the laminated resistance heating layers is smaller in the specific area surrounding portion than in the normal portion.

\* \* \* \* \*